United States Patent [19]

McGill

[11] 4,224,099

[45] Sep. 23, 1980

[54] METHOD FOR PRODUCING R-PLANE SINGLE CRYSTAL ALPHA ALUMINA

[75] Inventor: William C. McGill, Poway, Calif.

[73] Assignee: Union Carbide Corporation, New York, N.Y.

[21] Appl. No.: 932,629

[22] Filed: Aug. 10, 1978

Related U.S. Application Data

[63] Continuation of Ser. No. 656,736, Feb. 9, 1976, abandoned, which is a continuation-in-part of Ser. No. 484,257, Jun. 28, 1974, abandoned.

[51] Int. Cl.² ............................................. B01J 17/18
[52] U.S. Cl. ........................... 156/605; 156/DIG. 61; 156/617 SP
[58] Field of Search ......... 156/605, 617 SP, DIG. 61, 156/DIG. 65; 23/305 A, 305 P; 423/625; 106/42, 62, 65; 148/172

[56] References Cited

U.S. PATENT DOCUMENTS

| | | | |
|---|---|---|---|
| 3,527,574 | 9/1970 | La Belle, Jr. | 23/305 A |
| 3,650,703 | 3/1972 | La Belle, Jr. | 23/305 A |
| 3,715,194 | 2/1973 | Plooster | 156/DIG. 61 |
| 3,798,007 | 3/1974 | Bachman et al. | 23/273 SP |
| 3,824,302 | 7/1974 | Alexandrov et al. | 156/DIG. 61 |
| 3,912,521 | 10/1975 | Cline et al. | 156/DIG. 61 |
| 4,025,386 | 5/1977 | Rothrock | 156/DIG. 61 |

FOREIGN PATENT DOCUMENTS

248008 11/1963 Australia ........................ 156/DIG. 61

OTHER PUBLICATIONS

Yamamoto, Sci. Res. Insti., Tohoksin, Univ A (Japan), vol. 22, #4, Feb. 1971, 156–164.
Kronberg, Acta Metallurgica, vol. 5, 1957, pp. 508–524.
Sahagian et al., Conference, Growth of Crystals, Moscow, USSR, (20–21 Jul. 1966), 183–194.
Hawley Condensed Chemical Dictionary, 8th Ed., Van Hostrand Reinhold, 1971, pp. 212, 214.

*Primary Examiner*—Hiram H. Bernstein
*Attorney, Agent, or Firm*—Frederick J. McCarthy, Jr.

[57] ABSTRACT

Method for producing massive unicrystalline R-plane alpha alumina of circular cross-section from an alumina melt containing additions of chromium, iron or magnesium oxides.

5 Claims, 4 Drawing Figures

METHOD FOR PRODUCING R-PLANE SINGLE CRYSTAL ALPHA ALUMINA

This application is a continuation of our prior U.S. application: Ser. No. 656,736 filed Feb. 9, 1976 which is a continuation-in-part of application Ser. No. 484,257 filed June 28, 1974. Both of the foregoing applications are abandoned.

The present invention relates to a method for producing unicrystalline alpha alumina material. More particularly, the present invention is directed to a method for producing unicrystalline alpha alumina material having an R-plane orientation.

A process for producing unicrystalline alpha alumina material in massive form by pulling a seed rod from a melt is disclosed in U.S. Pat. No. 3,715,194—Plooster and the present invention is an improvement of the method disclosed therein, the disclosure of U.S. Pat. No. 3,715,194 being incorporated herein by reference.

The process disclosed in the above-noted patent is successfully employed in the production of massive unicrystalline alpha alumina material which was used for a wide variety of applications such as optical windows, bearings, wear plates, cutters and the like.

It has recently been of interest to provide R-plane unicrystalline alpha alumina material for such uses as passive substrates for electronic circuits since R-plane unicrystalline alpha alumina provides significant well known advantages compared to other crystal orientations.

An R-plane unicrystalline alpha alumina material, as is known to the art, is at a C-axis orientation of $57\frac{1}{2}°$ having one of its R-planes normal to its growth axis.

In producing such R-plane unicrystalline alpha alumina material from water white alumina by the method of the above-mentioned U.S. patent, it has been found that the massive unicrystalline material produced did not form as a mass of substantially circular cross-section as was the usual case with other crystal orientations, but instead consistently formed with a highly elliptical cross-section. Such a shape is inefficient in view of the industrial demand for circular substrates, considerable wastage of material necessarily resulting in forming circular cross-sections from an elliptical mass.

It is, therefore, an object of the present invention to provide a method for producing massive unicrystalline R-plane alpha alumina shapes having a substantially circular cross-section.

Other objects will be apparent from the following description and claims taken in conjunction with the drawing in which FIG. 1 shows an apparatus suitable for the practice of the present invention.

Figure 1:
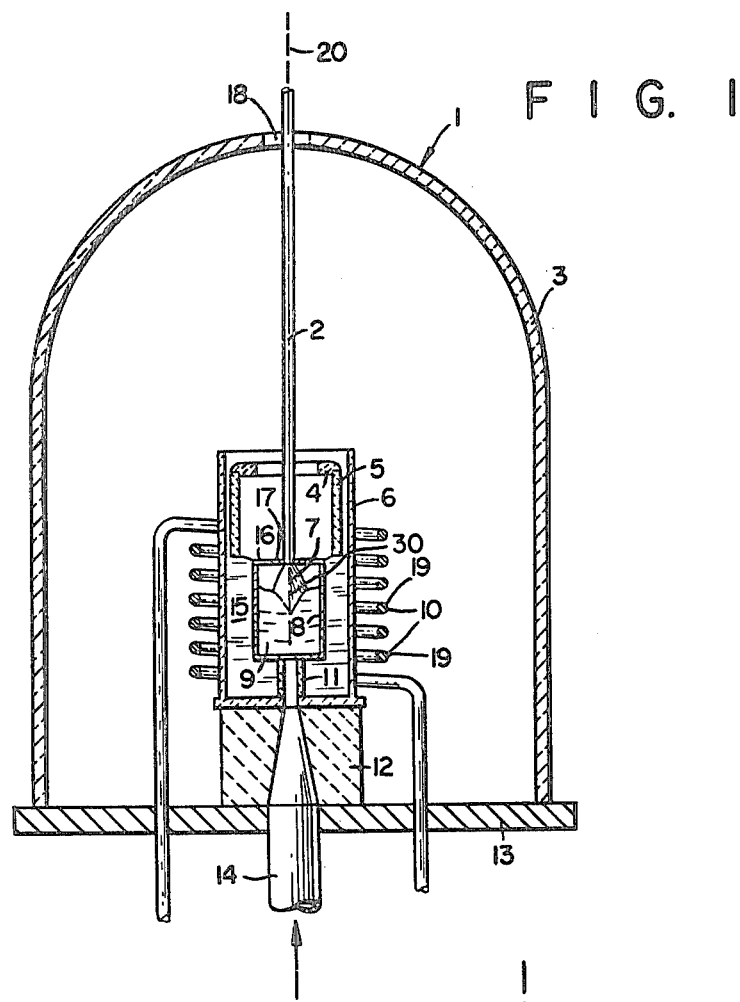
FIG. 1(a) illustrates the seed rod orientation for the practice of the present invention.

The method of the present invention for producing R-plane unicrystalline alpha alumina involves the following steps:

(i) forming a melt of alumina by heating the same with a predetermined amount of at least one metal oxide selected from the group consisting of chromium oxide, iron oxide, and magnesium oxide to form a melt at a temperature of at least 2040° C., (ii) inserting a seed rod of unicrystalline alpha alumina into the melt, said seed rod having an orientation such that its longitudinal axis is normal to an R-plane of said seed rod, (iii) maintaining an atmosphere over the melt which is substantially chemically inert to the melt, and (iv) withdrawing the seed rod from the melt such that alumina material is solidified and crystallized on the seed rod to form a massive unicrystalline product of increasing length and substantially circular cross-section having a growth axis common with the longitudinal axis of the seed rod.

The improvement of the present invention with respect to the method of the above-mentioned U.S. Pat. No. 3,715,194 resides in the inclusion in an alumina melt and in the crystal grown therefrom of at least one of the metal ions of chromium, iron or magnesium in an appropriate amount while employing a unicrystalline alpha alumina seed rod having an R-plane orientation. By so doing, a massive R-plane unicrystalline material of circular cross-section is readily obtained, e.g. the largest diameter of the crystal is not more than about 10% larger than the shortest diameter. Also, it has been found that fast crystal growth rates can be achieved without detrimentally affecting the quality of the unicrystalline material.

In the practice of the present invention, the amount of chromium ion provided in the alpha alumina crystal can be as low as about 135 parts per million (ppm) by weight of $Al_2O_3$; with the preferred amount being from about 240 to 340 ppm; the amount of iron ion provided in the crystal can be as low as about 730 ppm, with the preferred addition being about 950 to 1100 ppm; the amount of magnesium ion provided in the crystal can be as low as 90 ppm, with the preferred amount being from about 120 to 180 ppm. With the minimum and preferred amounts noted above, substantially circular cross-section masses of unicrystalline alpha alumina R-plane material are obtained which are lightly colored and transparent which enables the use of relatively fast growth rates and facilitates quality control. In the case of chromium additions, the color of the material is pink; with iron brown tint and with magnesium organe tint. At higher additions, above 20,000 ppm, the material is provided with a substantially circular cross-section but becomes deeply colored and essentially opaque and the growth rate is required to be generally slower and quality control more difficult.

The metal additions to the alumina crystal are accomplished by melting additions of chromium, iron and magnesium oxides, e.g. $Cr_2O_3(Cr^{+++})$, $Fe_2O_3(Fe^{+++})$, $MgO(Mg^{++})$ with alumina to obtain the desired metal ion content.

In general, for purposes of the present invention when using more than one addition, magnesium can be considered to be about 1.5 times more effective than chromium and about eight times more effective than iron and this relation can be used in determining the ranges for mixed additions.

The ranges noted hereinabove are listed in the following table:

TABLE

| Oxide Addition | Wt. % of oxide in Al₂O₃ Melt | ppm of oxide in Al₂O₃ Melt | Wt. % of Metal in Al₂O₃ Melt | ppm of Metal in Al₂O₃ Melt |
|---|---|---|---|---|
| $Cr_2O_3$ | .02 | 200 | .0135 | 135 |
|  | .035 | 350 | .024 | 240 |
|  | .05 | 500 | .034 | 340 |
| MgO | .015 | 150 | .009 | 90 |
|  | .02 | 200 | .012 | 120 |
|  | .03 | 300 | .018 | 180 |
| $Fe_2O_3$ | .10 | 1000 | .073 | 730 |
|  | .13 | 1300 | .095 | 950 |
|  | .15 | 1500 | .110 | 1100 |

With reference to FIG. 1, which corresponds to FIG. 1 of the above-noted U.S. Pat. No. 3,715,194, there is illustrated a crystal growth chamber 1. Alumina melt 9 having an addition of one or more metal oxides as described above is contained in a crucible 8 which is preferably fabricated from iridium. A washer 16, preferably iridium, having a central aperture 17 rests on top the crucible 8 and acts as a radiation shield to reduce heat loss from the melt 9. The crucible 8 is bounded on its sides and bottom with insulation 15. The insulation is preferably zirconia and serves to: reduce the power required to sustain the melt 9; reduce thermal gradients along the crucible; and to dampen temperature fluctuations arising from line voltage fluctuations, convective cooling effects from the atmosphere, as well as other disturbances. Hollow tubing 11 forms an aperture through which the temperature of the bottom of the crucible 8 can be determined by, for example, a radiation pyrometer focused on the center of the bottom of the crucible.

A ceramic washer 4, fabricated from alumina for example, is supported by tubing 5 preferably of zirconia. The washer 4 serves as a secondary radiation shield and to restrict the convective currents of the atmosphere against entering the top of the crucible and reaching the growing crystal 7. Thus, it serves to reduce the vertical temperature gradients in the vicinity of the growing crystal and to augment the effects of the washer 16.

Sleeve 6, formed of silicon dioxide, for example, serves to contain the insulation 15 and serves as a part of the insulating assembly surrounding the crucible 8. The tubing 5 which serves to support the washer 4 also functions as a part of the insulating system.

Figure 1A:
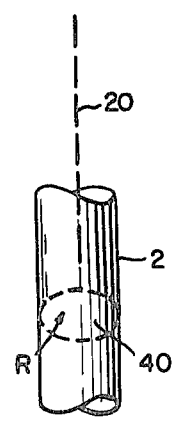

The crucible 8 and its surrounding insulating assembly rests on a ceramic pedestal 12 composed of, for example, zirconium oxide ($ZrO_2$). The entire assembly is enclosed in a bell jar 3 sealed to a base plate 13. The base plate 13 is composed of any suitable material such as for example silicone-bonded fiber glass. The desired gas atmosphere for the inside of the crucible 8, i.e. a gas atmosphere non-reactive with the melt in the crucible, e.g. nitrogen, noble gases, is introduced into sight tube 14 which communicates with tubing 11. The gas exits through the hole 18 in the bell jar 3 through which the seed rod 2 is inserted. Seed rod 2 is in the form of unicrystalline alpha alumina material having its longitudinal axis 20 common with the growth axis 30 of crystal 7 and the unicrystalline material of seed rod 2 is such that an R-plane 40 thereof is normal to the longitudinal axis 20 as shown in FIG. 1(a). Such a seed rod can be routinely prepared and results in the production of a massive unicrystalline material of R-plane orientation.

Figure 2A:
FIG. 2(a) is a photograph showing a massive R-plane unicrystalline alpha alumina shape of circular produced by the practice of the present invention and FIG. 2(b) is a photograph showing a massive R-plane unicrystalline alpha alumina shape of elliptical cross-section produced by without following the practice of the present invention.

Using the above described apparatus, an addition of an oxide selected from the group of chromium oxide, iron oxide and magnesium oxide is added to the water white alumina melt, for example by including the selected oxide addition with the initial alumina charge prior to melting or by addition to the alumina charge after it has become molten. The temperature of the melt is maintained at 2040° C. or higher and a unicrystalline mass is pulled from the melt following procedures known to the art as exemplified by U.S. Pat. No. 3,715,194. The resulting unicrystalline R-plane alpha alumina material has a substantially circular cross-section as illustrated in the photograph of FIG. 2(a) produced from alumina with an additive of 0.026% by weight $Cr_2O_3$ (180 ppm chromium). This can be compared to the elliptical cross-section obtained for the R-plane alpha alumina material of FIG. 2(b) which was prepared in essentially the same manner without any addition.

The following examples will further illustrate the present invention.

EXAMPLE I

About 7000 grams of cleaned chunks of alumina crackle (sapphire) together with 1.84 grams of $Cr_2O_3$ (260 ppm) were placed in an iridium crucible having an inside diameter of five inches, a wall thickness of 0.1 inch and a height of ten inches. The crucible was placed within a ten turn induction heating coil having an I.D. of 9.5 inches. The crucible stood on a pedestal containing packed zirconia powder while the space between the coil and the crucible was also packed with zirconia powder. This entire apparatus was enclosed in an aluminum bell jar having an aperture at its top. A nitrogen atmosphere containing about 600 ppm oxygen was maintained inside the bell jar. The induction heating coil was energized from a well known R.F. induction heating unit and the power was increased until the induced current in the iridium crucible heated it to a "white heat". Conductive heat from the iridium crucible then melted the alumina chunks and $Cr_2O_3$ to form a melt containing 180 ppm chromium. A unicrystalline R-plane alpha alumina seed rod 0.3 inch diameter was lowered through the aperture in the bell jar until it contacted the surface of the melt. The seed was then withdrawn from the melt at about 0.1 inch per hour for 125 hours. A final substantially circular cross-section elongated boule having diameter measurements of 2.294 inch (longest diameter)×2.260 inch (shortest diameter) and length of about 14 inches was obtained. This (180 ppm chromium) boule was massive, pink, transparent, non-granular unicrystalline alpha alumina of substantially circular cross-section as shown in FIG. 2(a).

EXAMPLE II

About 6200 grams of cleaned chunks of alumina crackle (sapphire) without any addition were placed in an iridium crucible having an inside diameter of five inches, a wall thickness of 0.1 inch and a height of ten inches. The crucible was placed within a ten turn induction heating oil having an I.D. of 9.5 inches. The crucible stood on a pedestal containing packed zirconia powder while the space between the coil and the crucible was also packed with zirconia powder. This entire apparatus was enclosed in a glass bell jar having an aperture at its top. A nitrogen atmosphere containing about 3000 ppm oxygen was maintained inside the bell jar. The induction heating coil was energized from a well known R.F. induction heating unit and the power was increased until the induced current in the iridium crucible heated it to a "white heat". Conductive heat from the iridium crucible then melted the alumina chunks to form a melt. A unicrystalline R-plane alpha alumina seed rod 0.3 inch diameter was lowered through the aperture in the bell jar until it contacted the surface of the melt. The seed was then withdrawn from the melt at about 0.09 inch per hour for 110 hours. A final elongated boule of elliptical cross-section having diameter measurements of 2.640 (longest diameter)×2.094 inch (shortest diameter). This boule was massive non-granular unicrystalline alpha alumina (corundum) of elliptical cross-section as shown in FIG. 2(b).

EXAMPLE III

About 7000 grams of cleaned chunks of alumina crackle (sapphire) together with 3.1 grams of $Cr_2O_3$ (440 ppm) were placed in an iridium crucible having an inside diameter of five inches, a wall thickness of 0.1 inch and a height of ten inches. The crucible was placed within a ten turn induction heating coil having an I.D. of 9.5 inches. The crucible stood on a pedestal containing packed zirconia powder while the space between the coil and the crucible was also packed with zirconia powder. This entire apparatus was enclosed in an aluminum bell jar having an aperture at its top. A nitrogen atmosphere containing about 600 ppm oxygen was maintained inside the bell jar. The induction heating coil was energized from a well known R.F. induction heating unit and the power was increased until the induced current in the iridium crucible heated it to a "white heat". Conductive heat from the iridium crucible then melted the alumina chunks and $Cr_2O_3$ to form a melt containing 300 ppm chromium. A unicrystalline R-plane alpha alumina seed rod 0.3 inch diameter was lowered through the aperture in the bell jar until it contacted the surface of the melt. The seed was then withdrawn from the melt at about 0.100 inch per hour for 103 hours. A final substantially circular cross-section elongated boule having diameter measurements of about 2.42 inch (longest diameter)×2.36 inch (shortest diameter) and a length of about 13.7 inches was obtained. This boule (300 ppm chromium) was massive, pink, transparent non-granular unicrystalline alpha alumina of substantially circular cross-section.

Figure 2B:

In addition to the foregoing examples, oxide additions of $V_2O_5$, $MnO_2$ and NiO were also tested but did not provide substantially circular cross-section material, the material having an elliptical cross-section such as shown in FIG. 2(b).

What is claimed is:

1. In a process for the production of massive unicrystalline alpha alumina by
   (i) forming a melt of alumina by heating the same to form a melt at a temperature of at least 2040° C.,
   (ii) inserting a seed rod of alpha alumina into the melt,
   (iii) maintaining an atmosphere over the melt which is substantially chemically inert to the melt,
   (iv) withdrawing the seed rod from the melt such that alumina material is solidified and crystallized on the seed rod to form a massive unicrystalline product of increasing length having a growth axis common with the longitudinal axis of the seed rod, the improvement for producing massive unicrystalline R-plane alpha alumina of substantially circular cross-section which comprises
   (a) forming a melt of alumina with at least one oxide selected from the group consisting of chromium oxide, iron oxide and magnesium oxide, the aggregate amount of selected oxide provided from about 90 ppm to 20,000 ppm in the aggregate of selected metal ion in the melt to provide a unicrystalline product of substantially circular cross-section, and
   (b) employing as the seed rod a seed rod of unicrystalline alpha alumina at a C-axis orientation of 57½° having an orientation such that its growth axis is normal to an R-plane of said seed rod.

2. A process in accordance with claim 1 wherein the selected oxide is $Cr_2O_3$.

3. A process in accordance with claim 1 wherein the selected oxide is $Fe_2O_3$.

4. A process in accordance with claim 1 wherein the selected oxide is MgO.

5. A process in accordance with claim 1 wherein the aggregate amount of selected oxide provides from about 90 ppm to 1100 ppm in the aggregate of selected metal ion in the melt.

* * * * *